United States Patent
Wang et al.

(10) Patent No.: US 11,308,838 B2
(45) Date of Patent: Apr. 19, 2022

(54) SHIFT REGISTER AND DRIVING METHOD THEREFOR, GATE DRIVER CIRCUIT AND DISPLAY APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Zhichong Wang, Beijing (CN); Fuqiang Li, Beijing (CN); Jing Feng, Beijing (CN); Peng Liu, Beijing (CN); Xinglong Luan, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/051,738

(22) PCT Filed: Jan. 21, 2020

(86) PCT No.: PCT/CN2020/073590
§ 371 (c)(1),
(2) Date: Oct. 29, 2020

(87) PCT Pub. No.: WO2020/156386
PCT Pub. Date: Aug. 6, 2020

(65) Prior Publication Data
US 2021/0166602 A1    Jun. 3, 2021

(30) Foreign Application Priority Data
Jan. 30, 2019    (CN) .......................... 201910092615.4

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0267* (2013.01); *G09G 2310/0286* (2013.01); *G09G 2310/08* (2013.01)

(58) Field of Classification Search
CPC ............. G09G 3/20; G09G 2310/0267; G09G 2310/0286; G09G 2310/08; G11C 19/28
See application file for complete search history.

(56) References Cited

U.S. PATENT DOCUMENTS

| | | | |
|---|---|---|---|
| 2015/0325190 A1* | 11/2015 | Cao | G11C 19/28 345/100 |
| 2016/0266699 A1 | 9/2016 | Zhao et al. | |

(Continued)

FOREIGN PATENT DOCUMENTS

| | | |
|---|---|---|
| CN | 104021769 A | 9/2014 |
| CN | 104900268 A | 9/2015 |

(Continued)

OTHER PUBLICATIONS

Office Action dated Mar. 11, 2020 in counterpart CN Patent Application No. 201910092615.4, 20 pages.

*Primary Examiner* — Sejoon Ahn
(74) *Attorney, Agent, or Firm* — Procopio, Cory, Hargreaves & Savitch LLP

(57) ABSTRACT

A shift register includes a first transistor, a second transistor, a pull-up node and a switch sub-circuit. A control electrode of the first transistor is connected to a signal input terminal, a first electrode of the first transistor is connected to a first voltage terminal, and a second electrode of the first transistor is connected to a first control node. A control electrode of the second transistor is connected to a reset signal terminal, a (Continued)

first electrode of the second transistor is connected to a second voltage terminal, and a second electrode of the second transistor is connected to the first control node. The switching sub-circuit is connected to the first control node and the pull-up node, and is configured to control a line between the first control node and the pull-up node to be closed and opened.

17 Claims, 7 Drawing Sheets

(56) References Cited

U.S. PATENT DOCUMENTS

| | | | |
|---|---|---|---|
| 2017/0039968 A1* | 2/2017 | Chen | G09G 3/3677 |
| 2017/0269769 A1 | 9/2017 | Hu | |
| 2018/0082629 A1 | 3/2018 | Wang | |
| 2020/0090611 A1 | 3/2020 | Han et al. | |
| 2020/0380935 A1* | 12/2020 | Ignaszewski | G06F 1/1622 |
| 2020/0380937 A1* | 12/2020 | Yano | G09G 5/37 |

FOREIGN PATENT DOCUMENTS

| | | |
|---|---|---|
| CN | 105185290 A | 12/2015 |
| CN | 105427793 A | 3/2016 |
| CN | 107068077 A | 8/2017 |
| CN | 107749281 A | 3/2018 |
| CN | 109584780 A | 4/2019 |
| EP | 3346458 A1 | 7/2018 |
| EP | 3706111 A1 | 9/2020 |
| WO | 2017118156 A1 | 7/2017 |

* cited by examiner

SHIFT REGISTER AND DRIVING METHOD THEREFOR, GATE DRIVER CIRCUIT AND DISPLAY APPARATUS

CROSS-REFERENCE TO RELATED APPLICATIONS

This application is a national phase entry under 35 USC 371 of International Patent Application No. PCT/CN2020/073590 filed Jan. 21, 2020, which claims priority to Chinese Patent Application No. 201910092615.4, filed Jan. 30, 2019, which are incorporated herein by reference in their entirety.

TECHNICAL FIELD

The present disclosure relates to the field of display technologies, and in particular, to a shift register and a driving method therefor, a gate driver circuit, and a display device.

BACKGROUND

GOA (Gate driver on array) is a technique of integrating a gate driver circuit into an array substrate. Each stage shift register in a GOA circuit is connected to a gate line, and is configured to output a gate scanning signal to the gate line, so as to achieve progressive scanning of a plurality of gate lines in a display panel.

SUMMARY

In an aspect, a shift register is provided. The shift register includes a first transistor, a second transistor, a pull-up node and a switching sub-circuit. A control electrode of the first transistor is connected to a signal input terminal, a first electrode of the first transistor is connected to a first voltage terminal, and a second electrode of the first transistor is connected to a first control node. A control electrode of the second transistor is connected to a reset signal terminal, a first electrode of the second transistor is connected to a second voltage terminal, and a second electrode of the second transistor is connected to the first control node. The switching sub-circuit is connected to the first control node and the pull-up node, and is configured to control a line between the first control node and the pull-up node to be closed and opened.

In some embodiments, the shift register further includes a pull-down node, an output sub-circuit, a first control sub-circuit, a second control sub-circuit, a pull-down sub-circuit and a first storage sub-circuit. The output sub-circuit is connected to a first clock signal terminal, the pull-up node and a signal output terminal, and is configured to transmit a voltage of the first clock signal terminal to the signal output terminal under control of a voltage of the pull-up node. The first control sub-circuit is connected to the pull-up node, the pull-down node, a third voltage terminal and a first control terminal, and is configured to transmit a voltage of the first control terminal to the pull-down node, and/or transmit a voltage of the third voltage terminal to the pull-down node. The second control sub-circuit is connected to the pull-down node, the pull-up node, and the third voltage terminal, and is configured to transmit the voltage of the third voltage terminal to the pull-up node under control of a voltage of the pull-down node. The pull-down sub-circuit is connected to the pull-down node, the third voltage terminal and the signal output terminal, and is configured to transmit the voltage of the third voltage terminal to the signal output terminal under the control of the voltage of the pull-down node. The first storage sub-circuit is connected to the pull-up node and the signal output terminal, and is configured to store the voltage of the pull-up node and discharge electricity to the pull-up node.

In some embodiments, the switching sub-circuit is further connected to a second clock signal terminal, and is configured to control the line between the first control node and the pull-up node to be closed and opened under control of a voltage of the second clock signal terminal. The first control terminal is a fourth voltage terminal. The first control sub-circuit is configured to transmit a voltage of the fourth voltage terminal to the pull-down node under control of the voltage of the fourth voltage terminal, and/or transmit the voltage of the third voltage terminal to the pull-down node under control of the voltage of the pull-up node.

In some embodiments, the switching sub-circuit includes a fourth transistor. A control electrode of the fourth transistor is connected to the second clock signal terminal, a first electrode of the fourth transistor is connected to the first control node, and a second electrode of the fourth transistor is connected to the pull-up node. The first control sub-circuit includes a fifth transistor and a sixth transistor. A control electrode and a first electrode of the fifth transistor are both connected to the fourth voltage terminal, and a second electrode of the fifth transistor is connected to the pull-down node. A control electrode of the sixth transistor is connected to the pull-up node, a first electrode of the sixth transistor is connected to the third voltage terminal, and a second electrode of the sixth transistor is connected to the pull-down node.

In some embodiments, the shift register further includes a switch control sub-circuit and a second storage sub-circuit. The switch control sub-circuit is connected to a second clock signal terminal, a second control node, and the pull-up node. The switch control sub-circuit is configured to transmit a voltage of the second clock signal terminal to the second control node under control of the voltage of the second clock signal terminal or under the control of the voltage of the pull-up node. The second storage sub-circuit is connected to the second control node and the third voltage terminal, and is configured to store a voltage of the second control node, and discharge electricity to the second control node. The switching sub-circuit is further connected to the second control node, and is configured to control the line between the first control node and the pull-up node to be closed and opened under control of the voltage of the second control node.

In some embodiments, in a case where the shift register further includes the first control sub-circuit, the first control terminal is a fourth voltage terminal. The first control sub-circuit is further connected to the second control node. The first control sub-circuit is configured to transmit a voltage of the fourth voltage terminal to the pull-down node under control of the voltage of the second control node, and/or transmit a voltage of the third voltage terminal to the pull-down node under control of the voltage of the pull-up node.

In some embodiments, the switching sub-circuit includes a fourth transistor. A control electrode of the fourth transistor is connected to the second control node, a first electrode of the fourth transistor is connected to the first control node, and a second electrode of the fourth transistor is connected to the pull-up node. The switch control sub-circuit includes a ninth transistor and a tenth transistor. A control electrode of the ninth transistor is connected to the pull-up node, a first electrode of the ninth transistor is connected to the second clock signal terminal, and a second electrode of the ninth transistor is connected to the second control node. A control electrode and a first electrode of the tenth transistor are both connected to the second clock signal terminal, and a second electrode of the tenth transistor is connected to the second control node. The second storage sub-circuit includes a second capacitor; and a first terminal of the second capacitor is connected to the second control node, and a second terminal of the second capacitor is connected to the third voltage terminal. The first control sub-circuit includes a fifth transistor and a sixth transistor. A control electrode of the fifth transistor is connected to the second control node, a first electrode of the fifth transistor is connected to the fourth voltage terminal, and a second electrode of the fifth transistor is connected to the pull-down node; and a control electrode of the sixth transistor is connected to the pull-up node, a first electrode of the sixth transistor is connected to the third voltage terminal, and a second electrode of the sixth transistor is connected to the pull-down node.

In some embodiments, in a case where the shift register further includes the first control sub-circuit, the first clock signal terminal, and the second clock signal terminal. The first control sub-circuit is configured to transmit a voltage of the first control terminal to a pull-down node under control of a voltage of the first control terminal, and/or transmit a voltage of the third voltage terminal to the pull-down node under control of the voltage of the pull-up node. The first control terminal is a fourth voltage terminal. Or the first control terminal is the first clock signal terminal or the second clock signal terminal, the shift register further includes a third storage sub-circuit; and the third storage sub-circuit is connected to the pull-down node and the third voltage terminal, and is configured to store a voltage of the pull-down node and discharge electricity to the pull-down node.

In some embodiments, the switching sub-circuit includes a fourth transistor. A control electrode of the fourth transistor is connected to the second control node, a first electrode of the fourth transistor is connected to the first control node, and a second electrode of the fourth transistor is connected to the pull-up node. The switch control sub-circuit includes a ninth transistor and a tenth transistor. A control electrode of the ninth transistor is connected to the pull-up node, a first electrode of the ninth transistor is connected to the second clock signal terminal, and a second electrode of the ninth transistor is connected to the second control node. A control electrode and a first electrode of the tenth transistor are both connected to the second clock signal terminal, and a second electrode of the tenth transistor is connected to the second control node. The second storage sub-circuit includes a second capacitor; and a first terminal of the second capacitor is connected to the second control node, and a second terminal is connected to the third voltage terminal. The first control sub-circuit includes a fifth transistor and a sixth transistor. A control electrode and a first electrode of the fifth transistor are both connected to the first control terminal, and a second electrode of the fifth transistor is connected to the pull-down node. A control electrode of the sixth transistor is connected to the pull-up node, a first electrode of the sixth transistor is connected to the third voltage terminal, and a second electrode of the sixth transistor is connected to the pull-down node. In a case where the first control terminal is the first clock signal terminal or the second clock signal terminal, and the shift register includes the third storage sub-circuit, the third storage sub-circuit includes a third capacitor, a first terminal of the third capacitor is connected to the pull-down node, and a second terminal of the third capacitor is connected to the third voltage terminal.

In some embodiments, the output sub-circuit includes a third transistor; and a control electrode of the third transistor is connected to the pull-up node, a first electrode of the third transistor is connected to the first clock signal terminal, and a second electrode of the third transistor is connected to the signal output terminal. The second control sub-circuit includes an eighth transistor; and a control electrode of the eighth transistor is connected to the pull-down node, a first electrode of the eighth transistor is connected to the third voltage terminal, and a second electrode of the eighth transistor is connected to the pull-up node. The pull-down sub-circuit includes a seventh transistor; and a control electrode of the seventh transistor is connected to the pull-down node, a first electrode of the seventh transistor is connected to the third voltage terminal, and a second electrode of the seventh transistor is connected to the signal output terminal. The first storage sub-circuit includes a first capacitor; and a first terminal of the first capacitor is connected to the pull-up node, and a second terminal of the first capacitor is connected to the signal output terminal.

In another aspect, a gate driver circuit is provided. The gate driver circuit includes N stages of cascaded shift registers according to some embodiments described above. N is greater than or equal to 2, and N is a positive integer. A signal input terminal of a first-stage shift register is connected to a start signal terminal. A signal input terminal of an M-th-stage shift register is connected to a signal output terminal of a (M−1)-th-stage shift register, and M is greater than 1 and less than or equal to N. A reset signal terminal of a K-th-stage shift register is connected to a signal output terminal of a (K+1)-th-stage shift register, and K is greater than or equal to 1 and less than N. A reset signal terminal of an N-th-stage shift register is connected to a reset signal line, or the reset signal terminal of the N-th-stage shift register is connected to the start signal terminal.

In yet another aspect, a display device is provided. The display device includes the gate driver circuit according to some embodiments described above.

In yet another aspect, a driving method for the shift register according to some embodiments described above is provided. The driving method includes an input period, an output period and a reset period. In the input period, an turn-on signal is transmitted to the signal input terminal to control the first transistor to be turned on, so that a voltage of the first voltage terminal is transmitted to the first control node; and the switching sub-circuit is controlled to be turned on, so that a voltage of the first control node is transmitted to the pull-up node. In an output period, the switching sub-circuit is controlled to be turned off, so that the line between the first control node and the pull-up node is opened. In a reset period, a reset signal is transmitted to the reset signal terminal, so that the second transistor is turned on to transmit a voltage of the second voltage terminal to the first control node; and the switching sub-circuit is controlled to be turned on to transmit the voltage of the first control node to the pull-up node for resetting.

In some embodiments, in a case where the shift register further includes a pull-down node, an output sub-circuit, a first control sub-circuit, a second control sub-circuit, a pull-down sub-circuit, and a first storage sub-circuit, the driving method further includes: in the input period, storing a voltage of the pull-up node in the first storage sub-circuit, and under control of the voltage of the pull-up node, the output sub-circuit being turned on to transmit a voltage of a first clock signal terminal to the signal output terminal; in the output period, the first storage sub-circuit discharging electricity to the pull-up node; under the control of the voltage of the pull-up node, the output sub-circuit being maintained in a turn-on state to transmit the voltage of the first clock signal terminal to the signal output terminal, and under control of a voltage of the signal output terminal, further raising, by the first storage sub-circuit, a discharge voltage to the pull-up node; and in the reset period, under control of a voltage of the pull-down node, the pull-down sub-circuit being turned on to transmit a voltage of the third voltage terminal to the signal output terminal for resetting, under the control of the voltage of the pull-down node, the second control sub-circuit being turned on to transmit the voltage of the third voltage terminal to the pull-up node for resetting, and before a next image frame, the pull-down sub-circuit being maintained in a turn-on state under the control of the voltage of the pull-down node to continuously transmit the voltage of the third voltage terminal to the signal output terminal.

In some embodiments, in a case where the shift register further includes a switch control sub-circuit and a second storage sub-circuit, the driving method further includes: in the input period, under control of a voltage of a second clock signal terminal, the switch control sub-circuit being turned on, so that the voltage of the second clock signal terminal is transmitted to the second control node to control the switching sub-circuit to be turned on; in the output period, under the control of the voltage of the pull-up node, the switch control sub-circuit being turned on, so that the voltage of the second clock signal terminal is transmitted to the second control node to control the switching sub-circuit to be turned off; and in the reset period, under the control of the voltage of the second clock signal terminal, the switch control sub-circuit being turned on, so that the voltage of the second clock signal terminal is transmitted to the second control node to store the voltage of the second clock signal terminal in the second storage sub-circuit; and the switching sub-circuit being turned on under control of a voltage of the second control node.

The driving method further includes: in a discharge period after the reset period, the second storage sub-circuit discharging to the second control node, and the switching sub-circuit being maintained in a turn-on state under the control of the voltage of the second control node; and before the next image frame, the switching sub-circuit being maintained in the turn-on state under alternate control of the switch control sub-circuit and the second storage sub-circuit.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, an actual process of a method and actual timings of signals that the embodiments of the present disclosure relate to.

DETAILED DESCRIPTION

Technical solutions in some embodiments of the present disclosure will be described below clearly and completely in combination with the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the description and the claims are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to same embodiment(s) or example(s). In addition, the specific features, structures, materials or characteristics may be included in any one or more embodiments or examples in any suitable manner.

The terms such as "first" and "second" are used for descriptive purposes only, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a plurality of" means two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more elements are not in direct contact with each other, but still cooperate or interact with each other. The embodiments disclosed herein are not necessarily limited to the contents herein.

The phrase "A and/or B" includes the following three combinations: only A, only B, and a combination of A and B.

Figure 1A:
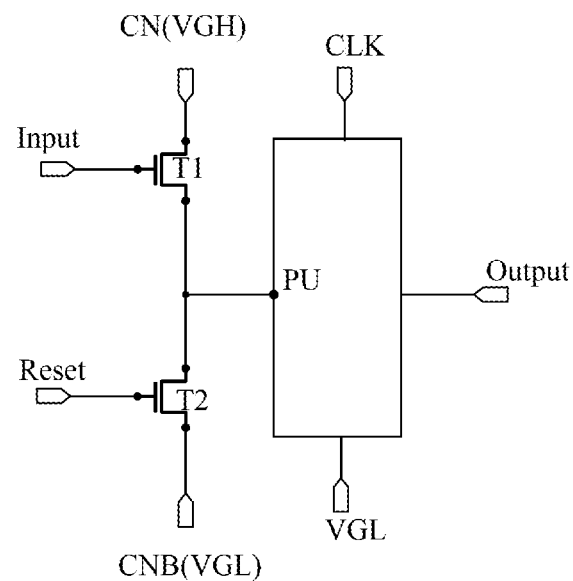
FIG. 1A is a schematic diagram showing a structure of a shift register under forward scan mode in the related art.

As for a shift register in a GOA circuit with a bidirectional scanning function in the related art, for example, when the GOA circuit performs forward scan, as shown in FIG. 1A, a signal terminal in the shift register connected to a control electrode of a transistor T1 is used as a signal input terminal Input, a first electrode of the transistor T1 is connected to a first voltage terminal, and a second electrode of the transistor T1 is connected to a pull-up node PU. The first voltage terminal provides a high potential voltage VGH. When the transistor T1 is in a reverse bias state, the transistor T1 is prone to a negative threshold voltage shift. Especially in a case where the transistor T1 is an oxide transistor, the negative shift of the transistor T1 is particularly serious due to instability of an oxide semiconductor material in the oxide transistor.

Figure 1B:
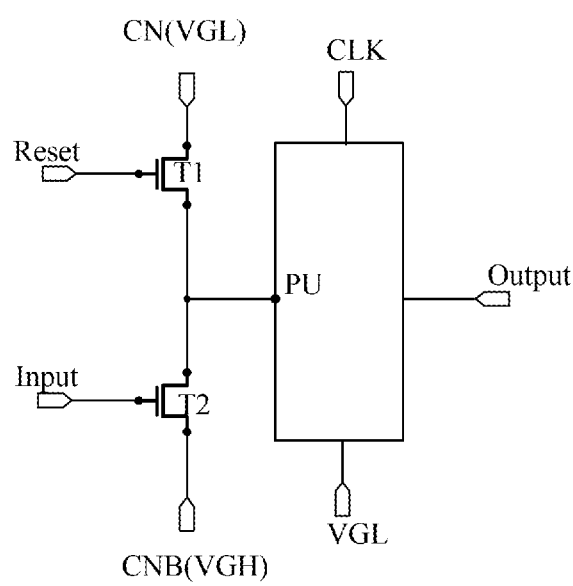
FIG. 1B is a schematic diagram showing a structure of a shift register under reverse scan mode in the related art.

When the GOA circuit performs reverse scan, as shown in FIG. 1B, the signal terminal in the shift register connected to the control electrode of the transistor T1 is used as a reset signal terminal Reset. The first voltage terminal provides a low potential voltage VGL. In this way, in a charging period, there is a risk that a voltage of the pull-up node PU of the shift register is leaked through the transistor T1 and the voltage of the pull-up node PU is reduced to a low potential voltage (e.g., VGL). This easily causes insufficient charging of the pull-up node PU, thereby causing a failure of the shift register.

On this basis, some embodiments of the present disclosure provide a shift register. As shown in FIGS. 2, 3, 4, 5A and 5B, the shift register includes a pull-up node PU and a pull-down node PD, and the shift register further includes a first transistor M1 and a second transistor M2.

A control electrode of the first transistor M1 is connected to a signal input terminal Input, a first electrode of the first transistor M1 is connected to a first voltage terminal CN, and a second electrode of the first transistor M1 is connected to a first control node O1. A control electrode of the second transistor M2 is connected to a reset signal terminal Reset, a first electrode of the second transistor M2 is connected to a second voltage terminal CNB, and a second electrode of the second transistor M2 is connected to the first control node O1.

It will be understood herein that, a gate driver circuit including the shift register can perform two kinds of scan, i.e., the forward scan and the reverse scan, (that is, the gate driver circuit can perform the bidirectional scan) by adjusting potentials at signal terminals (e.g., swaping potentials at the first voltage terminal CN and the second voltage terminal CNB).

On this basis, the shift register further includes a switching sub-circuit 100. The switching sub-circuit 100 is connected to the first control node O1 and the pull-up node PU. The switching sub-circuit 100 is configured to control a line between the first control node O1 and the pull-up node PU to be closed and opened, so that the line between the first control node O1 and the pull-up node PU is closed when the switching sub-circuit 100 is turned on, thereby transmitting a voltage of the first control node O1 to the pull-up node PU; and the line between the first control node O1 and the pull-up node PU are opened (the first control node O1 and the pull-up node PU are isolated) when the switching sub-circuit 100 is turned off, thereby reducing an effect of a potential at the first control node O1 on the pull-up node PU.

On this basis, as shown in FIGS. 2, 3, 4 and 5, the shift register further includes an output sub-circuit 101, a first control sub-circuit 1021, a second control sub-circuit 1022, a pull-down sub-circuit 103, and a first storage sub-circuit 201.

The output sub-circuit 101 is connected to a first clock signal terminal CK1, the pull-up node PU, and a signal output terminal Output. The output sub-circuit 101 is configured to transmit a voltage of the first clock signal terminal CK1 to the signal output terminal Output under control of a voltage of the pull-up node PU.

The first control sub-circuit 1021 is connected to the pull-up node PU, the pull-down node PD, a third voltage terminal VGL, and a first control terminal S. The first control sub-circuit 1021 is configured to transmit a voltage of the first control terminal S to the pull-down node PD, and/or transmit a voltage of the third voltage terminal VGL to the pull-down node PD.

The second control sub-circuit 1022 is connected to the pull-down node PD, the pull-up node PU, and the third voltage terminal VGL. The second control sub-circuit 1022 is configured to transmit the voltage of the third voltage terminal VGL to the pull-up node PU under control of a voltage of the pull-down node PD.

The pull-down sub-circuit 103 is connected to the pull-down node PD, the third voltage terminal VGL, and the signal output terminal Output. The pull-down sub-circuit 103 is configured to transmit the voltage of the third voltage terminal VGL to the signal output terminal Output under the control of the voltage of the pull-down node PD.

The first storage sub-circuit 201 is connected to the pull-up node PU and the signal output terminal Output. The first storage sub-circuit 201 is configured to store the voltage of the pull-up node PU, and discharge electricity to the pull-up node PU.

In summary, by using the shift register in some embodiments of the present disclosure, it is possible to control the line between the first control node O1 and the pull-up node PU to be closed and opened by controlling the switching sub-circuit 100 to be turned on and off. As for a driving method for the shift register, reference may be made to subsequent contents in the description. In this way, by controlling the line between the first control node O1 and the pull-up node PU to be closed in an input period, charging of the pull-up node may be ensured. By controlling the line between the first control node O1 and the pull-up node PU to be opened in an output period, the voltage of the pull-up node PU may be coupled and raised normally without being affected by the potential at the first control node O1, which may ensure a normal input of a scanning signal, and from a reset period to a time before a next image frame, reset and noise reduction can be performed normally.

It will be seen that, by using the shift register in some embodiments of the present disclosure, even if in a case where the shift register performs the bidirectional scan, and a threshold voltage of a transistor connected to the first control node O1 shifts, since as for the shift register in some embodiments of the present disclosure, the line between the pull-up node PU and the first control node O1 may be opened (the first control node O1 and the pull-up node PU are isolated) by turning off the switching sub-circuit 100 in the output period, the effect of the potential at the first control node O1 on the pull-up node PU may be reduced, thereby solving a problem of insufficient charging of the pull-up node caused by a current leakage which is caused by the shift of the threshold voltage of the transistor connected to the first control node O1.

Figure 2:
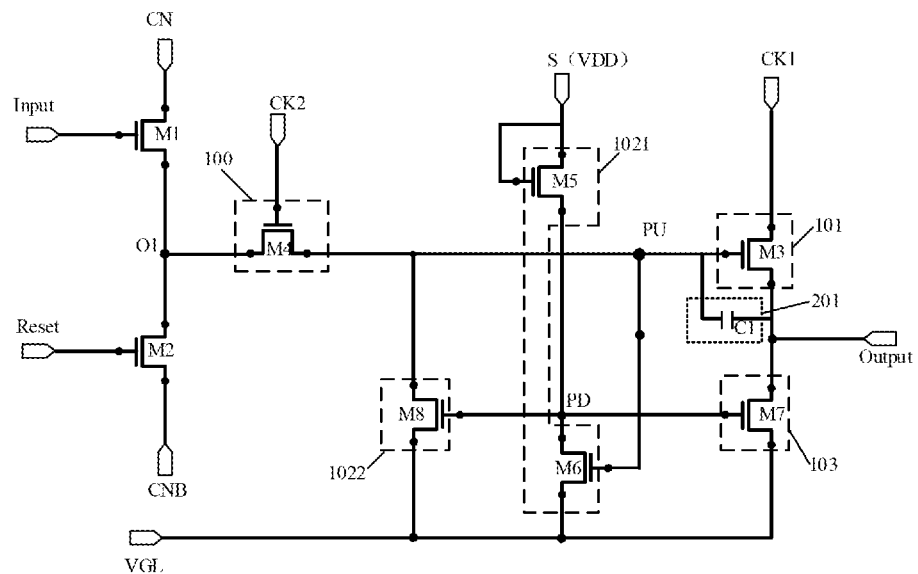
FIG. 2 is a schematic diagram showing a structure of a shift register, in accordance with some embodiments of the present disclosure.

In addition, through an actual simulation comparison between the shift register in the related art (e.g., the shift register in FIGS. 1A and 1B) and the shift register provided in some embodiments of the present disclosure (e.g., the shift register in FIG. 2) during the bidirectional scan, the applicants of the present disclosure learn that, when the shift register shown in FIGS. 1A and 1B in the related art performs the bidirectional scan, if a threshold voltage of a transistor T2 shifts to −3.1 V, the GOA circuit which the shift register belongs to may fail, whereas when the shift register shown in FIG. 2 in the embodiments of the present disclosure is used, if a threshold voltage of the second transistor M2 shifts to −5.8 V, the GOA circuit which the shift register belongs to may fail. In comparison, it will be seen that, when the GOA circuit which the shift register in the embodiments of the present disclosure belongs to fails, an allowable range of a shift of a threshold voltage of a corresponding transistor increases by 2.7 V. That is, by using the shift register in the embodiments of the present disclosure, it is possible to reduce a risk of failure of the GOA circuit caused by the insufficient charging of the pull-up node caused by the current leakage.

In addition, it will be noted that, although the shift register provided by the embodiments of the present disclosure is designed to solve the problem of insufficient charging of the pull-up node caused by the current leakage caused by the shift of the threshold voltage of the transistor connected to the first control node during the bidirectional scan, specific applications of the shift register are not limited thereto. The shift register provided by the embodiments of the present disclosure may be applied to a GOA circuit performing a bidirectional scan, and may also be applied to a GOA circuit performing a unidirectional scan, which may be selectively set according to actual needs.

For example, arrangements of the above sub-circuits will be further described below.

In some embodiments, as shown in FIGS. 2, 3, 4, 5A and 5B, the output sub-circuit 101 includes a third transistor M3. A control electrode of the third transistor M3 is connected to the pull-up node PU, a first electrode of the third transistor M3 is connected to the first clock signal terminal CK1, and a second electrode of the third transistor M3 is connected to the signal output terminal Output.

In some embodiments, as shown in FIGS. 2, 3, 4, 5A and 5B, the second control sub-circuit 1022 includes an eighth transistor M8. A control electrode of the eighth transistor M8 is connected to the pull-down node PD, a first electrode of the eighth transistor M8 is connected to the third voltage terminal VGL, and a second electrode of the eighth transistor M8 is connected to the pull-up node PU.

In some embodiments, as shown in FIGS. 2, 3, 4, 5A and 5B, the pull-down sub-circuit 103 includes a seventh transistor M7. A control electrode of the seventh transistor M7 is connected to the pull-down node, a first electrode of the seventh transistor M7 is connected to the third voltage terminal VGL, and a second electrode of the seventh transistor M7 is connected to the signal output terminal Output.

In some embodiments, as shown in FIGS. 2, 3, 4, 5A and 5B, the first storage sub-circuit 201 includes a first capacitor C1. A first terminal of the first capacitor C1 is connected to the pull-up node PU, and a second terminal of the first capacitor C1 is connected to the signal output terminal Output.

In addition, the arrangements of the switching sub-circuit 100 and related sub-circuits will be further described below through some embodiments.

In some embodiments, as shown in FIG. 2, the switching sub-circuit 100 is further connected to a second clock signal terminal CK2 on the basis of being connected to the first control node O1 and the pull-up node PU. The switching sub-circuit 100 is configured to control the line between the first control node O1 and the pull-up node PU to be closed and opened under control of a voltage of the second clock signal terminal CK2.

On this basis, as shown in FIG. 2, the first control terminal S connected to the first control sub-circuit 1021 is a fourth voltage terminal VDD. In this case, the first control sub-circuit 1021 is configured to transmit a voltage of the fourth voltage terminal VDD to the pull-down node PD, and/or transmit the voltage of the third voltage terminal VGL to the pull-down node PD under control of the voltage of the fourth voltage terminal VDD and the voltage of the pull-up node PU.

Optionally, as shown in FIG. 2, circuit structures of the switching sub-circuit 100 and the first control sub-circuit 1021 are as follows.

The switching sub-circuit 100 includes a fourth transistor M4. A control electrode of the fourth transistor M4 is connected to the second clock signal terminal CK2, a first electrode of the fourth transistor M4 is connected to the first control node O1, and a second electrode of the fourth transistor M4 is connected to the pull-up node PU.

The first control sub-circuit 1021 includes a fifth transistor M5 and a sixth transistor M6. A control electrode and a first electrode of the fifth transistor M5 are both connected to the fourth voltage terminal VDD, and a second electrode of the fifth transistor M5 is connected to the pull-down node. A control electrode of the sixth transistor M6 is connected to the pull-up node PU, a first electrode of the sixth transistor M6 is connected to the third voltage terminal VGL, and a second electrode of the sixth transistor M6 is connected to the pull-down node PD.

Figure 3:
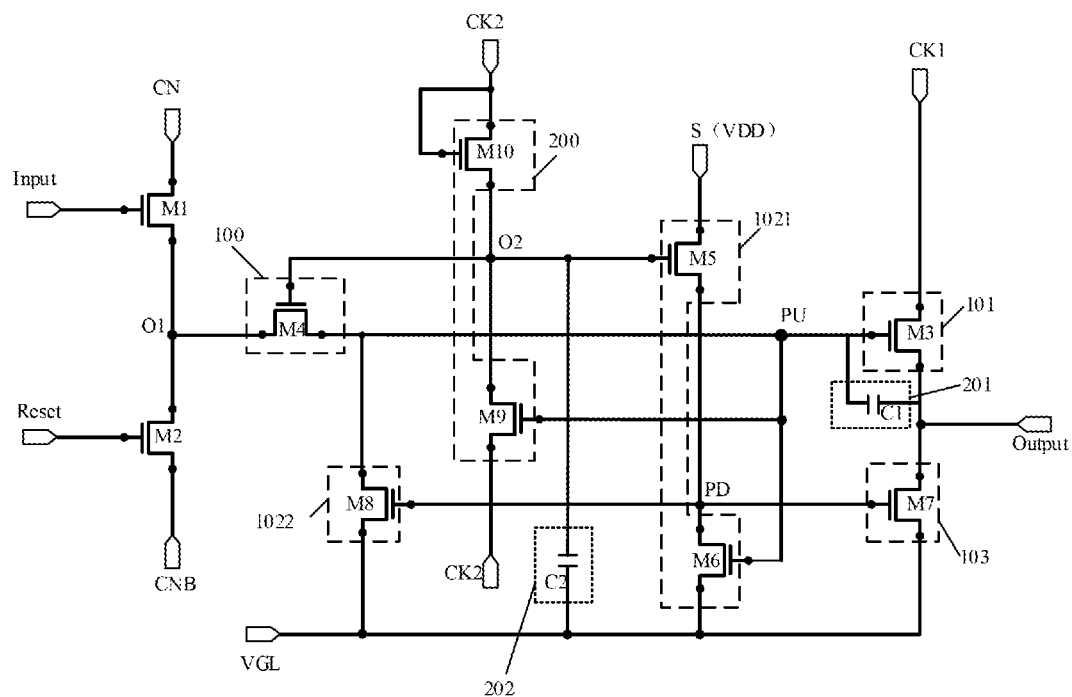
FIG. 3 is a schematic diagram showing a structure of another shift register, in accordance with some embodiments of the present disclosure.

In some other embodiments, as shown in FIG. 3, the shift register further includes a switch control sub-circuit 200 and a second storage sub-circuit 202.

The switch control sub-circuit 200 is connected to the second clock signal terminal CK2, a second control node O2, and the pull-up node PU. The switch control sub-circuit 200 is configured to transmit the voltage of the second clock signal terminal CK2 to the second control node O2 under the control of the voltage of the second clock signal terminal CK2, or transmit the voltage of the second clock signal terminal CK2 to the second control node O2 under the control of the voltage of the pull-up node PU.

The second storage sub-circuit 202 is connected to the second control node O2 and the third voltage terminal VGL. The second storage sub-circuit 202 is configured to store a voltage of the second control node O2 and discharge electricity to the second control node O2.

The switching sub-circuit 100 is further connected to the second control node O2 on the basis of being connected to the first control node O1 and the pull-up node PU. The switching sub-circuit 100 is configured to control the line between the first control node O1 and the pull-up node PU to be closed and opened under control of the voltage of the second control node O2.

On this basis, as shown in FIG. 3, the first control terminal S connected to the first control sub-circuit 1021 is the fourth voltage terminal VDD, and the first control sub-circuit 1021 is further connected to the second control node O2. The first control sub-circuit 1021 is configured to transmit the voltage of the fourth voltage terminal VDD to the pull-down node PD, and/or transmit the voltage of the third voltage terminal VGL to the pull-down node PD under control of both the voltage of the second control node O2 and the voltage of the pull-up node PU.

Optionally, as shown in FIG. 3, circuit structures of the switching sub-circuit 100, the first control sub-circuit 1021 and the second storage sub-circuit 202 are as follows.

The switching sub-circuit 100 includes the fourth transistor M4. The control electrode of the fourth transistor M4 is connected to the second control node O2, the first electrode of the fourth transistor M4 is connected to the first control node O1, and the second electrode of the fourth transistor M4 is connected to the pull-up node PU.

The switch control sub-circuit 200 includes a ninth transistor M9 and a tenth transistor M10. A control electrode of the ninth transistor M9 is connected to the pull-up node, a first electrode of the ninth transistor M9 is connected to the second clock signal terminal CK2, and a second electrode of the ninth transistor M9 is connected to the second control node O2. A control electrode and a first electrode of the tenth transistor M10 are both connected to the second clock signal terminal CK2, and a second electrode of the tenth transistor M10 is connected to the second control node O2.

The second storage sub-circuit 202 includes a second capacitor C2. A first terminal of the second capacitor C2 is connected to the second control node O2, and a second terminal of the second capacitor C2 is connected to the third voltage terminal VGL.

On this basis, the first control sub-circuit 1021 includes the fifth transistor M5 and the sixth transistor M6. The control electrode of the fifth transistor M5 is connected to the second control node O2, the first electrode of the fifth transistor M5 is connected to the fourth voltage terminal VDD, and the second electrode of the fifth transistor M5 is connected to the pull-down node PD. The control electrode of the sixth transistor M6 is connected to the pull-up node PU, the first electrode of the sixth transistor M6 is connected to the third voltage terminal VGL, and the second electrode of the sixth transistor M6 is connected to the pull-down node PD.

Figure 4:
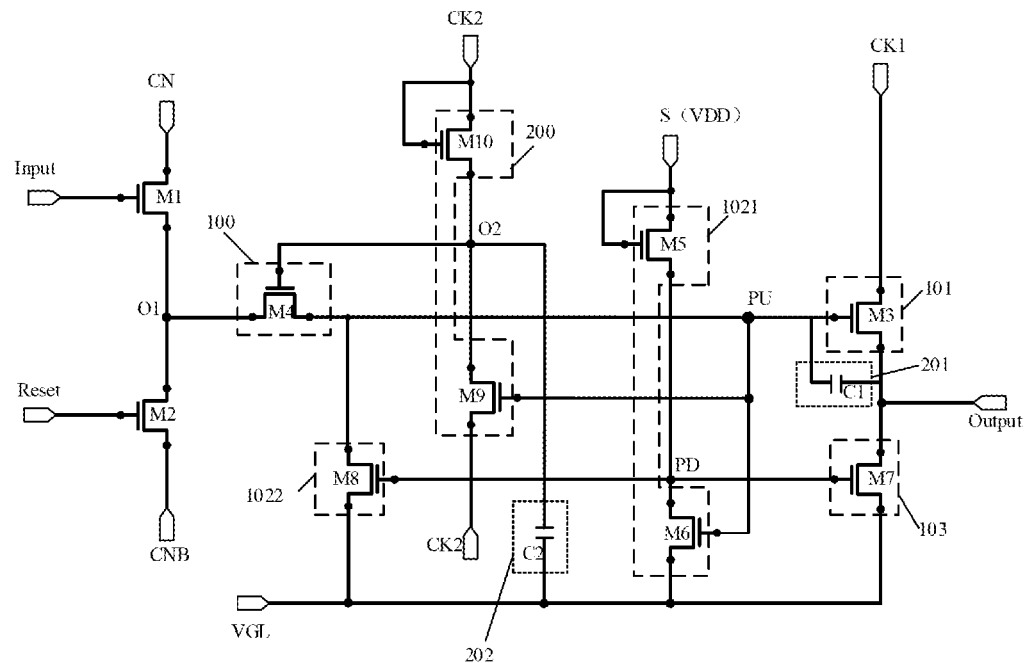
FIG. 4 is a schematic diagram showing a structure of yet another shift register, in accordance with some embodiments of the present disclosure.

In yet some embodiments, as shown in FIG. 4, the shift register further includes the switch control sub-circuit 200 and the second storage sub-circuit 202.

The switch control sub-circuit 200 is connected to the second clock signal terminal CK2, the second control node O2, and the pull-up node PU. The switch control sub-circuit 200 is configured to transmit the voltage of the second clock signal terminal CK2 to the second control node O2 under the control of the voltage of the second clock signal terminal CK2. The switch control sub-circuit 200 is further configured to transmit the voltage of the second clock signal terminal CK2 to the second control node O2 under the control of the voltage of the pull-up node PU.

The second storage sub-circuit 202 is connected to the second control node O2 and the third voltage terminal VGL. The second storage sub-circuit 202 is configured to store the voltage of the second control node O2. The second storage sub-circuit 202 is further configured to discharge electricity to the second control node O2.

The switching sub-circuit 100 is further connected to the second control node O2 on the basis of being connected to the first control node O1 and the pull-up node PU. The switching sub-circuit 100 is configured to control the line between the first control node O1 and the pull-up node PU to be closed and opened under the control of the voltage of the second control node O2.

On this basis, as shown in FIG. 4, the first control terminal S connected to the first control sub-circuit 1021 is the fourth voltage terminal VDD. The first control sub-circuit 1021 is configured to transmit the voltage of the fourth voltage terminal VDD to the pull-down node PD, and/or transmit the voltage of the third voltage terminal VGL to the pull-down node PD under the control of both the voltage of the fourth voltage terminal VDD and the voltage of the pull-up node PU.

Figure 5A:
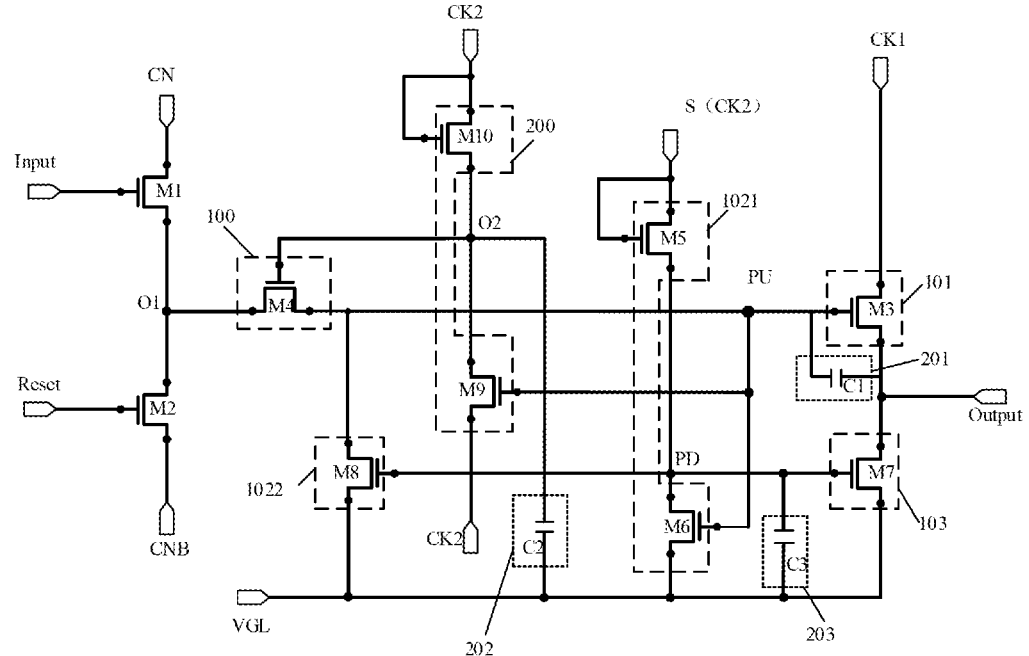
FIG. 5A is a schematic diagram showing a structure of yet another shift register, in accordance with some embodiments of the present disclosure.

In yet some embodiments, as shown in FIG. 5A, the shift register further includes the switch control sub-circuit 200 and the second storage sub-circuit 202.

In these embodiments, structures of the switch control sub-circuit 200 and the second storage sub-circuit 202 are the same as the structures of the switch control sub-circuit 200 and the second storage sub-circuit 202 in some embodiments described above, and details will not be repeated herein.

A difference between the shift register provided in these embodiments and the shift register provided in some embodiments described above is that, as shown in FIG. 5A, the first control terminal S connected to the first control sub-circuit 1021 is the second clock signal terminal CK2 in the shift register provided in these embodiments. The first control sub-circuit 1021 is configured to transmit the voltage of the second clock signal terminal CK2 to the pull-down node PD, and/or transmit the voltage of the third voltage terminal VGL to the pull-down node PD under control of both the voltage of the second clock signal terminal CK2 and the voltage of the pull-up node PU.

In addition, in these embodiments, the shift register further includes a third storage sub-circuit 203. The third storage sub-circuit 203 is connected to the pull-down node PD and the third voltage terminal VGL. The third storage sub-circuit 203 is configured to store the voltage of the pull-down node PD, and discharge electricity to the pull-down node PD.

Figure 5B:
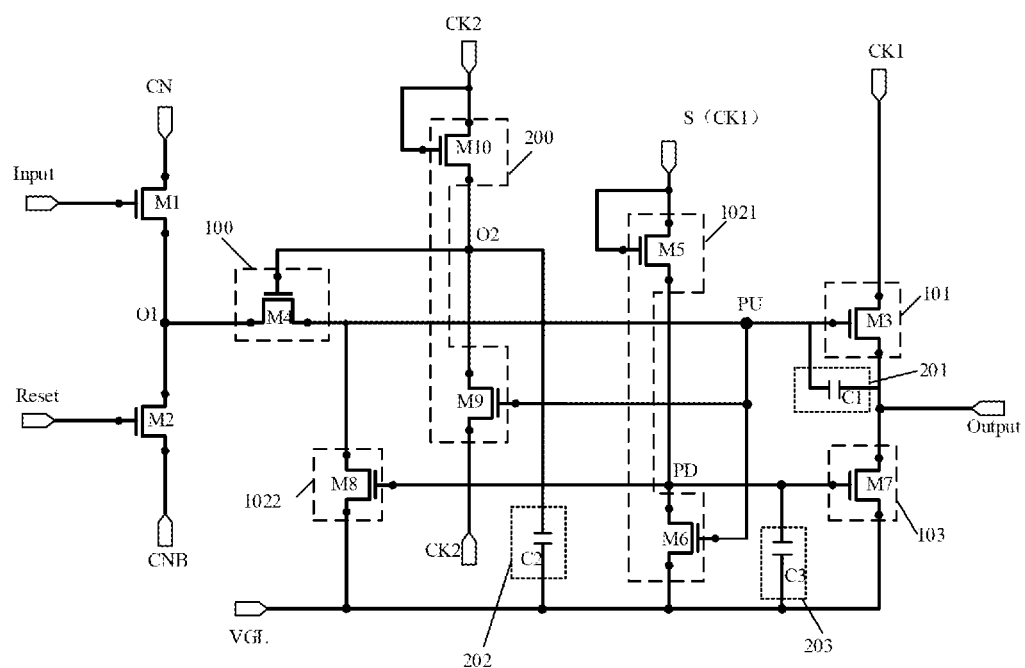
FIG. 5B is a schematic diagram showing a structure of yet another shift register, in accordance with some embodiments of the present disclosure.

In yet some embodiments, as shown in FIG. 5B, a difference between the shift register provided in these embodiments and the shift register provided in the foregoing embodiments is that, as shown in FIG. 5B, the first control terminal S connected to the first control sub-circuit 1021 is the first clock signal terminal CK1 in the shift register provided in these embodiments. Arrangements of remaining sub-circuits are substantially the same as those in the foregoing embodiments, and details will not be repeated herein.

In the embodiments shown in FIGS. 4, 5A and 5B, the circuit structures of the switch control sub-circuit 200 and the second storage sub-circuit 202 are as follows.

As shown in FIGS. 4, 5A and 5B, the switch control sub-circuit 200 includes the ninth transistor M9 and the tenth transistor M10. The control electrode of the ninth transistor M9 is connected to the pull-up node, the first electrode of the ninth transistor M9 is connected to the second clock signal terminal CK2, and the second electrode of the ninth transistor M9 is connected to the second control node O2. The control electrode and the first electrode of the tenth transistor M10 are both connected to the second clock signal terminal CK2, and the second electrode of the tenth transistor M10 is connected to the second control node O2.

The second storage sub-circuit 202 includes the second capacitor C2. The first terminal of the second capacitor C2 is connected to the second control node O2, and the second terminal of the second capacitor C2 is connected to the third voltage terminal VGL.

Correspondingly, the circuit structure of the first control sub-circuit 1021 is as follows.

In the embodiment shown in FIG. 4, the first control sub-circuit 1021 includes the fifth transistor M5 and the sixth transistor M6. The control electrode and first electrode of the fifth transistor M5 are both connected to the fourth voltage terminal VDD, and the second electrode of the fifth transistor M5 is connected to the pull-down node. The control electrode of the sixth transistor M6 is connected to the pull-up node PU, the first electrode of the sixth transistor M6 is connected to the third voltage terminal VGL, and the second electrode of the sixth transistor M6 is connected to the pull-down node PD.

In the embodiment shown in FIG. 5A, the first control sub-circuit 1021 includes the fifth transistor M5 and the sixth transistor M6. The control electrode and first electrode of the fifth transistor M5 are both connected to the second clock signal terminal CK2, and the second electrode of the fifth transistor M5 is connected to the pull-down node. The control electrode of the sixth transistor M6 is connected to the pull-up node PU, the first electrode of the sixth transistor M6 is connected to the third voltage terminal VGL, and the second electrode of the sixth transistor M6 is connected to the pull-down node PD.

In the embodiment shown in FIG. 5B, the first control sub-circuit 1021 includes the fifth transistor M5 and the sixth transistor M6. The control electrode and first electrode of the fifth transistor M5 are both connected to the first clock signal terminal CK1, and the second electrode of the fifth transistor M5 is connected to the pull-down node. The control electrode of the sixth transistor M6 is connected to the pull-up node PU, the first electrode of the sixth transistor M6 is connected to the third voltage terminal VGL, and the second electrode of the sixth transistor M6 is connected to the pull-down node PD.

In addition, in the embodiments shown in FIGS. 5A and 5B, the third storage sub-circuit 203 includes a third capacitor C3. A first terminal of the third capacitor C3 is connected to the pull-down node PD, and a second terminal of the second capacitor C3 is connected to the third voltage terminal VGL.

It will be noted that, the above transistors may be N-type transistors, or P-type transistors. The above transistors may be enhancement type transistors, or depletion type transistors. The above transistors may be amorphous silicon thin film transistors, polycrystalline silicon thin film transistors, or amorphous indium gallium zinc oxide thin film transistors. In addition, the control electrodes of the above transistors may be gates. The first electrodes of the above transistors may be sources and the second electrodes thereof may be drains, or, the first electrodes thereof may be drains and the second electrodes thereof may be sources.

Some embodiments of the present disclosure provide a gate driver circuit. The gate driver circuit includes at least two stages of cascaded shift registers described above.

Figure 6:
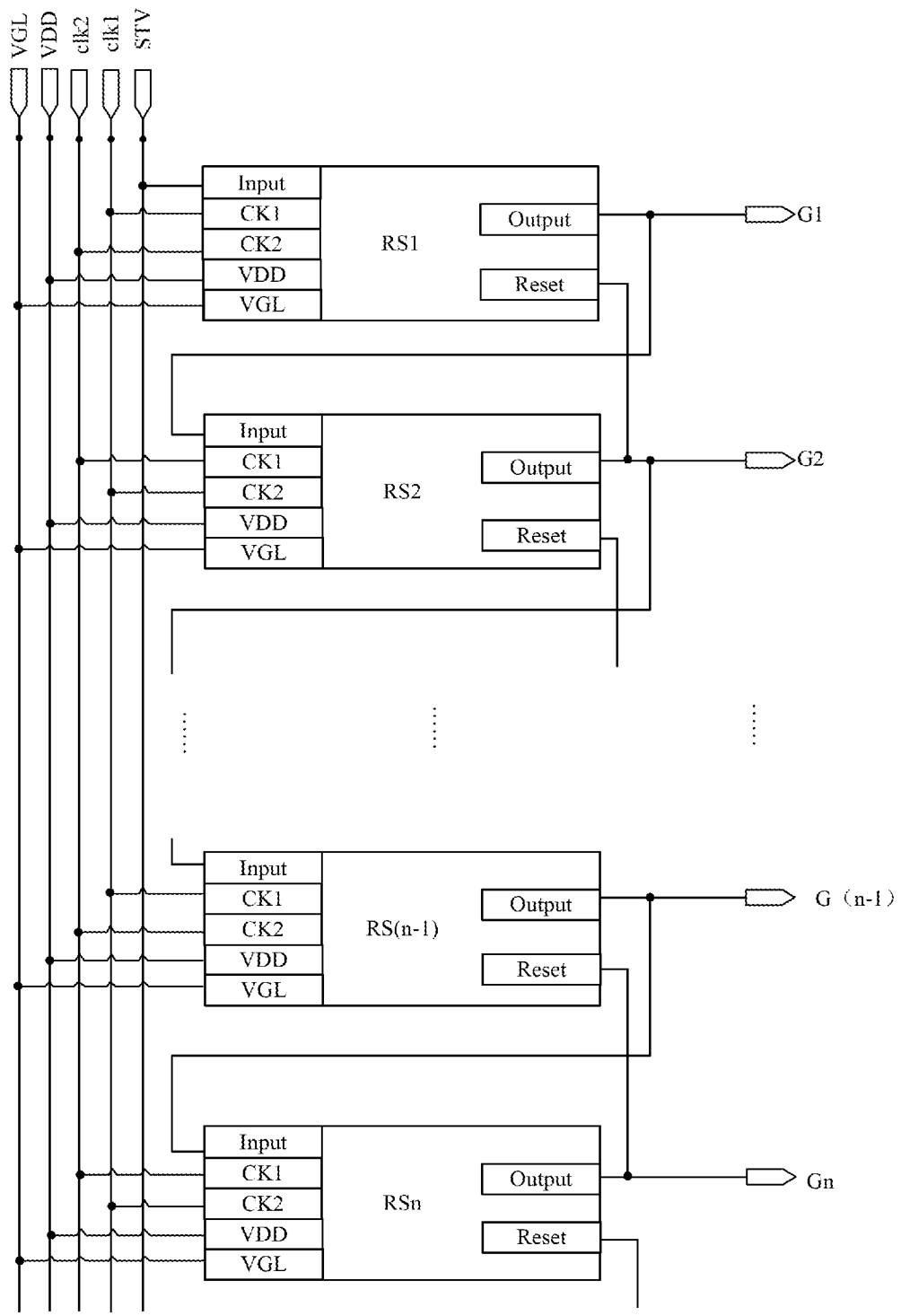
FIG. 6 is a schematic diagram showing a structure of a gate driver circuit, in accordance with some embodiments of the present disclosure.

In some embodiments, as shown in FIG. 6, the gate driver circuit includes N stages of cascaded shift registers, N is greater than or equal to 2, and N is a positive integer. In the gate driver circuit, a signal input terminal of a first-stage shift register RS1 is connected to a start signal terminal. Except the first stage shift register RS1, a signal input terminal of a shift register in any stage is connected to a signal output terminal of a shift register in a previous stage. That is, a signal input terminal of an M-th stage shift register is connected to a signal output terminal of a (M−1)-th stage shift register, and M is greater than 1, and is less than or equal to N. Except a last stage shift register RSn, an signal output terminal of a shift register in any stage is connected to a reset signal terminal of a shift register in a next stage. That is, a reset signal terminal of a K-th stage shift register is connected to a signal output terminal of a (K+1)-th stage shift register, and K is greater than or equal to 1, and is less than N. A reset signal terminal of an N-th stage (the last stage) shift register RSn is disposed separately. For example, the reset signal terminal of the N-th stage (the last stage) shift register RSn is connected to a reset signal line, or is connected to the start signal terminal, and n is equal to the total number of stages N of the shift registers in the gate driver circuit.

On this basis, as shown in FIG. 6, in the gate driver circuit:

N is an even number, first clock signal terminals CK1 in shift registers in odd-numbered stages (RS1, RS3, . . . and RSn−1) are connected to a first system clock signal terminal clk1, and second clock signal terminals CK2 thereof are connected to a second system clock signal terminal clk2. First clock signal terminals CK1 in shift registers in even-numbered stages (e.g., RS2, RS4, . . . and RSn) are connected to the second system clock signal terminal clk2, and second clock signal terminals CK2 thereof are connected to the first system clock signal terminal clk1.

Herein, FIG. 6 shows an example in which the reset signal terminal of the last-stage shift register is disposed separately and the first control terminal S is the fourth voltage terminal VDD. Moreover, it will be understood that, the signal output terminals Output of the sequentially cascaded shift registers in the gate driver circuit are each connected to a respective one of gate lines (G1, G1, . . . , and Gn) sequentially disposed in a display area of a display panel, so as to scan the gate lines row by row.

The gate driver circuit includes the shift registers described above, and has the same structure and beneficial effects as the shift register provided by the above embodiments. Since the structure and beneficial effects of the shift register have been described in detail in the above embodiments, they will not be repeated herein.

Figure 9:
FIG. 9 is a schematic diagram showing a structure of a display device, in accordance with some embodiments of the present disclosure.

Referring to FIG. 9, some embodiments of the present disclosure provide a display device 1000. The display device 1000 includes the above gate driver circuit. The gate driver circuit also includes the above shift registers. The display device has the same structure and beneficial effects as the shift register provided by the above embodiments. Since the structure and beneficial effects of the shift register have been described in detail in the above embodiments, they will not be repeated herein.

It will be noted that, in the embodiments of the present disclosure, the display devices may include at least a liquid crystal display panel and an organic light-emitting diode (OLED) display panel. For example, the display device is any product or component having a display function such as a liquid crystal display panel, an electronic paper, an OLED panel, a mobile phone, a tablet computer, a television, a display, a notebook computer, a digital photo frame, or a navigator.

Some embodiments of the present disclosure provide a driving method for the above shift register.

Figure 7:
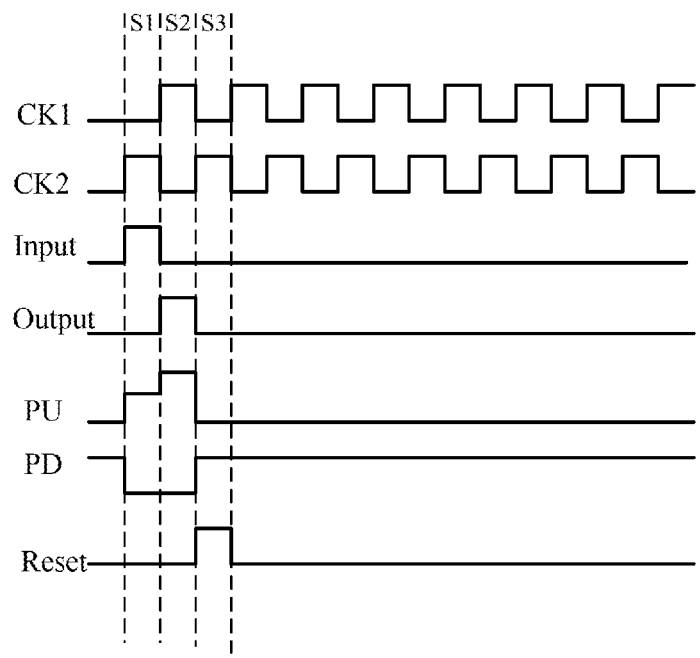
FIG. 7 is a timing diagram of signals for driving a shift register, in accordance with some embodiments of the present disclosure.
Figure 8:
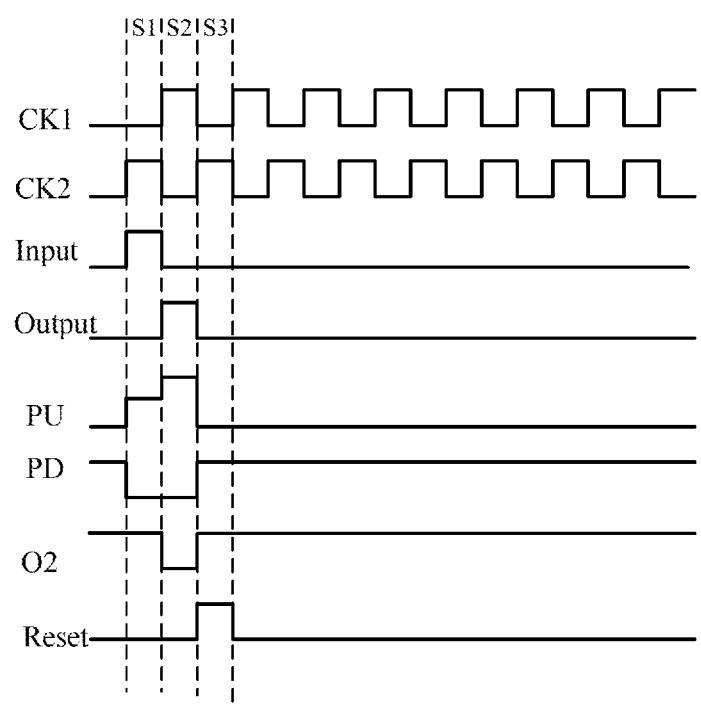
FIG. 8 is a timing diagram of signals for driving another shift register, in accordance with some embodiments of the present disclosure.

The driving method for the shift register will be further described below by taking an example in which the shift register shown in FIG. 2 corresponds to the timing diagram in FIG. 7 and the shift register shown in FIGS. 3, 4, 5A and 5B corresponds to the timing diagram in FIG. 8, and the method will be further described below in combination with turn-on and turn-off states of the transistors.

In an image frame, the driving method includes the following steps.

In an input period S1:

an turn-on signal is transmitted to the signal input terminal Input to control the first transistor M1 to be turned on, so that the voltage of the first voltage terminal CN is transmitted to the first control node O1.

The switching sub-circuit 100 is controlled to be turned on, so that the voltage of the first control node O1 is transmitted to the pull-up node PU.

In a case where the shift register further includes the first storage sub-circuit, the voltage of the pull-up node PU is stored in the first storage sub-circuit 201.

For example, as for the switching sub-circuit 100 shown in FIG. 2, the switching sub-circuit 100 is turned on under the control of the voltage of the second clock signal terminal CK2. As for the switching sub-circuit 100 shown in FIGS. 3, 4, 5A and 5B, the switch control sub-circuit 200 is controlled to be turned on by the voltage of the second clock signal terminal CK2, the voltage of the second clock signal terminal CK2 is transmitted to the second control node O2, and the switching sub-circuit 100 is turned on under the control of the voltage of the second control node O2.

Under the control of the voltage of the pull-up node PU, the output sub-circuit 101 is turned on, so that the voltage of the first clock signal terminal CK1 is transmitted to the signal output terminal Output.

In addition, in the input period S1, the first control sub-circuit 1021 is turned on, which may make the voltage of the first control terminal S transmitted to the pull-down node PD. Furthermore, as for the first control sub-circuit 1021 in FIG. 2, it may further transmit the voltage of the third voltage terminal VGL to the pull-down node PD under the control of the voltage of the fourth voltage terminal VDD (the first control terminal S) and the voltage of the pull-up node PU. As for the first control sub-circuit 1021 in FIG. 3, it may further transmit the voltage of the third voltage terminal VGL to the pull-down node PD under control of the voltage of the second control node O2, and the voltage of the pull-up node PU.

The input period S1 will be further described below by taking an example in which each transistor is an N-type transistor.

In the input period S1, under control of a high level signal (the turn-on signal) transmitted from the signal input terminal Input, the first transistor M1 is turned on, so that a high level signal from the first voltage terminal CN is transmitted to the first control node O1. By controlling the fourth transistor M4 to be turned on, a high level signal from the first control node O1 is transmitted to the pull-up node PU, and is stored in the first capacitor C1. Under control of a high level signal from the pull-up node PU, the third transistor M3 is turned on, so that a low level signal from the first clock signal terminal CK1 is transmitted to the signal output terminal Output.

Herein, as for the fourth transistor M4 in FIG. 2, its turn-on state is controlled by a high level signal from the second clock signal terminal CK2. As for a turn-on state of the fourth transistor M4 in FIGS. 3, 4, 5A and 5B, the tenth transistor M10 is controlled to be turned on by using the high level signal from the second clock signal terminal CK2, and the high level signal from the second clock signal terminal CK2 is transmitted to the second control node O2, so that the fourth transistor M4 is turned on under control of a high level signal from the second control node O2. Of course, in this period, the ninth transistor M9 may also be turned on by using the high level signal from the pull-up node PU, and the ninth transistor M9 may also transmit the high level signal from the second clock signal terminal CK2 to the second control node O2.

In addition, as for the shift register in FIGS. 2, 3, 4 and 5A, in the input period S1, both the fifth transistor M5 and the sixth transistor M6 in the first control sub-circuit 1021 are turned on (M5 in FIG. 2 being turned on under the control of CK2, and M5 in FIGS. 3, 4 and 5A being turned on under the control of O2). Since a size of the sixth transistor M6 is greater than a size of the fifth transistor M5 (i.e., a length-to-width ratio of a channel in a transistor), in the input period S1, a low level signal from the third voltage terminal VGL is transmitted to the pull-down node PD. As for the shift register in FIG. 5B, in the input period S1, the fifth transistor M5 in the first control sub-circuit 1021 is turned off, the sixth transistor M6 is turned on, and the low level signal from the third voltage terminal VGL is transmitted to the pull-down node PD.

In an output period S2:

the switching sub-circuit 100 is controlled to be turned off, so that the line between the first control node O1 and the pull-up node PU is opened.

In the output period S2, the first storage sub-circuit 201 discharges electricity to the pull-up node PU. Under the control of the voltage of the pull-up node PU, the output sub-circuit 101 is maintained in a turn-on state, so that the voltage of the first clock signal terminal CK1 (as a scanning signal) is transmitted to the signal output terminal Output. Under control of a voltage of the signal output terminal Output, a discharge voltage of the first storage sub-circuit 201 to the pull-up node PU may be further raised by the first storage sub-circuit 201, so that the voltage of the pull-up node PU is further raised.

For example, as for the switching sub-circuit 100 shown in FIG. 2, the switching sub-circuit 100 is controlled to be turned on by the voltage of the second clock signal terminal CK2. As for the switching sub-circuit 100 shown in FIGS. 3, 4, 5A and 5B, the switch control sub-circuit 200 is controlled to be turned on by the voltage of the pull-up node PU, which may make the voltage of the second clock signal terminal CK2 transmitted to the second control node O2, so as to control the switching sub-circuit 100 to be turned off under the control of the voltage of the second control node O2.

The output period S2 will be further described below by taking the example in which each transistor is the N-type transistor.

In the output period S2, the fourth transistor M4 is controlled to be turned off, and the line between the first control node O1 and the pull-up node PU is opened. The first capacitor C1 discharges (transmits) the high level signal stored in the input period S1 to the pull-up node PU. Under the control of the high level signal from the pull-up node PU, the third transistor M3 is maintained in a turn-on state, and a high level signal (as a scanning signal) from the first clock signal terminal CK1 is transmitted to the signal output terminal Output.

Under control of a high level signal from the signal output terminal Output, a discharge voltage of the first capacitor C1 to the pull-up node PU may be further raised due to a bootstrap action, so that the voltage of the pull-up node PU is further raised.

As for the fourth transistor M4 in FIG. 2, its turn-off state is controlled by using a low level signal from the second clock signal terminal CK2. As for a turn-off state of the fourth transistor M4 in FIGS. 3, 4, 5A and 5B, the ninth transistor M9 is controlled to be turned on by the high level signal from the pull-up node PU, and the low level signal from the second clock signal terminal CK2 is transmitted to the second control node O2, so that the fourth transistor M4 is turned off under control of a low level signal from the second control node O2.

In addition, as for the shift register in FIGS. 2, 3, 4 and 5B, in the output period S2, both the fifth transistor M5 and the sixth transistor M6 in the first control sub-circuit 1021 are turned on, and the low level signal from the third voltage terminal VGL is transmitted to the pull-down node PD. As for the shift register in FIG. 5A, in the output period S2, the fifth transistor M5 in the first control sub-circuit 1021 is turned off, the sixth transistor M6 is turned on, and the low level signal from the third voltage terminal VGL is transmitted to the pull-down node PD.

In a reset period S3:

a reset signal is transmitted to the reset signal terminal Reset, the second transistor M2 is turned on, and a voltage of the second voltage terminal CNB is transmitted to the first control node O1.

The switching sub-circuit 100 is controlled to be turned on, and a voltage of the first control node O1 is transmitted to the pull-up node PU for resetting.

Herein, a control process of the switching sub-circuit 100 in FIGS. 2, 3, 4, 5A and 5B is substantially the same as that in the input period S1, reference may be made to the corresponding description in the input period S1, and details will not be repeated herein.

In addition, as for the shift register in FIGS. 2, 3, 4 and 5A, in the reset period S3, the driving method therefor further includes: controlling the first control sub-circuit 1021 to be turned on, so as to transmit the voltage of the first control terminal S to the pull-down node PD; under the control of the voltage of the pull-down node PD, the pull-down sub-circuit 103 being turned on, so as to transmit the voltage of the third voltage terminal VGL to the signal output terminal Output for resetting; and under the control of the voltage of the pull-down node PD, the second control sub-circuit 1022 being turned on, so as to transmit the voltage of the third voltage terminal VGL to the pull-up node PU for resetting.

Before a next image frame, the pull-down sub-circuit 103 is maintained in a turn-on state under the control of the voltage of the pull-down node PD, so that the voltage of the third voltage terminal VGL is continuously transmitted to the signal output terminal Output.

For example, the reset period S3 and a period between the reset period S3 and the next image frame will be further described below by taking the example in which each transistor is the N-type transistor.

In the reset period S3, under control of a high level signal (the reset signal) transmitted from the reset signal terminal Reset, the second transistor M2 is turned on, and a low level signal from the second voltage terminal CNB is transmitted to the first control node O1. At the same time, the fourth transistor M4 is controlled to be turned on, so that a low level signal from the first control node O1 is transmitted to the pull-up node PU for resetting.

As for the fourth transistor M4 in FIG. 2, its turn-on state is controlled by the high level signal from the second clock signal terminal CK2. As for the turn-on state of the fourth transistor M4 in FIGS. 3, 4, 5A and 5B, the tenth transistor M10 is controlled to be turned on by the high level signal from the second clock signal terminal CK2, and the high level signal from the second clock signal terminal CK2 is transmitted to the second control node O2, so that the fourth transistor M4 is turned on under the control of the high level signal from the second control node O2.

In addition, in the reset period S3, the fifth transistor M5 in the first control sub-circuit 1021 in FIGS. 2, 3, 4 and 5A is turned on, and the sixth transistor M6 is turned off, so that a high level signal from the first control terminal S (corresponding to the fourth voltage terminal VDD in FIGS. 2, 3 and 4, or the second clock signal terminal CK2 in FIG. 5A) is transmitted to the pull-down node PD. In this way, under control of a high level signal from the pull-down node PD, the seventh transistor M7 is turned on, and the voltage of the third voltage terminal VGL is transmitted to the signal output terminal Output for resetting.

At the same time, under the control of the high level signal from the pull-down node PD, the eighth transistor M8 is turned on, and the low level signal from the third voltage terminal VGL is transmitted to the pull-up node PU for further resetting.

Before the next image frame, the seventh transistor M7 is maintained in a turn-on state under the control of the high level signal from the pull-down node PD, so that the low level signal from the third voltage terminal VGL is continuously transmitted to the signal output terminal Output for noise reduction.

In addition, other differences between the shift register in FIG. 2 and the shift register in FIGS. 3, 4, 5A and 5B in the driving process will be further described below.

First, the switching sub-circuit 100 in FIGS. 2, 3, 4, 5A and 5B is in an turn-off state in the output period S2 (i.e., the fourth transistor being off). However, as will be seen from the above disclosure, the switching sub-circuit 100 in FIG. 2 may be turned on or off periodically under control of a clock signal from the second clock signal terminal CK2. As for the switching sub-circuit 100 in FIGS. 3, 4, 5A and 5B, under control of the switch control sub-circuit 200, the switching sub-circuit 100 is only turned off in the output period S2, and is in a turn-on state during the input period S1, the reset period S3 and a subsequent period.

It will be understood that, as for a fact that the switching sub-circuit 100 in FIGS. 3, 4, 5A and 5B is maintained in the turn-on state in the reset period S3 and the subsequent period, the second storage sub-circuit 202 is charged in the reset period S3, thereby discharging to the second control node O2 in a discharge period after the reset period S3, which enables the switching sub-circuits 100 to be maintained in the turn-on state. In this way, until the next image frame, the switching sub-circuit 100 is maintained in the turn-on state under alternate control of the switch control sub-circuit 200 (same as the reset period) and the second storage sub-circuit 202 (the discharge period).

Second, as for the third storage sub-circuit 203 in FIGS. 5A and 5B, it will be understood that, after the output period S2, since the fifth transistor M5 is turned on or off periodically under the control of the second clock signal terminal CK2 or the first clock signal terminal CK1, a potential at the pull-down node PD will be affected (causing the potential at the pull-down node PD to drop) when the fifth transistor M5 is in an turn-off state. In this case, by providing the third storage sub-circuit 203 (e.g., the third capacitor C3), it is possible to ensure that a high potential at the pull-down node PD is still maintained under action of the third capacitor C3 in a case where the fifth transistor M5 is in the turn-off state, thereby ensuring that the seventh transistor M7 is maintained in the turn-on state after the output period.

In the above embodiments, turn-on and turn-off processes of the transistors are described by taking an example in which all transistors are the N-type transistors, the first voltage terminal CN is a high-level voltage terminal, the second voltage terminal CNB is a low-level voltage terminal, the third voltage terminal VGL is a low-level voltage terminal, and the fourth voltage terminal VDD is a high-level voltage terminal. In a case where all transistors are the P-type transistors, there is a need to adaptively adjust control signals in FIGS. 7 and 8, and the first voltage terminal, the second voltage terminal, the third voltage terminal and the fourth voltage terminal.

The forgoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register, comprising:
   a first transistor, a control electrode of the first transistor being connected to a signal input terminal, a first electrode of the first transistor being connected to a first voltage terminal, and a second electrode of the first transistor connected to a first control node;
   a second transistor, a control electrode of the second transistor being connected to a reset signal terminal, a first electrode of the second transistor being connected to a second voltage terminal, and a second electrode of the second transistor being connected to the first control node;
   a pull-up node; and
   a switching, sub-circuit, an end of the switching sub-circuit being connected to the first control node and another end of the switching sub-circuit being connected to the pull-up node, and the switching sub-circuit being configured to control connection and disconnection between the first control node and the pull-up node.

2. The shift register according to claim 1, further comprising: a pull-down node, an output sub-circuit, a first control sub-circuit, a second control sub-circuit, a pull-down sub-circuit, and a first storage sub-circuit, wherein
   the output sub-circuit is connected to a first clock signal terminal, the pull-up node and a signal output terminal, and is configured to transmit a voltage of the first clock signal terminal to the signal output terminal under control of a voltage of the pull-up node;
   the first control sub-circuit is connected to the pull-up node, the pull-down node, a third voltage terminal and a first control terminal, and is configured to transmit a voltage of the first control terminal to the pull-down node, and/or transmit a voltage of the third voltage terminal to the pull-down node;
   the second control sub-circuit is connected to the pull-down node, the pull-up node, and the third voltage terminal, and is configured to transmit the voltage of the third voltage terminal to the pull-up node under control of a voltage of the pull-down node;
   the pull-down sub-circuit is connected to the pull-down node, the third voltage terminal and the signal output terminal, and is configured to transmit the voltage of the third voltage terminal to the signal output terminal under the control of the voltage of the pull-down node; and the first storage sub-circuit is connected to the pull-up node and the signal output terminal, and is configured to store the voltage of the pull-up node and discharge electricity to the pull-up node.

3. The shift register according to claim 2, wherein the switching sub-circuit is further connected to a second clock signal terminal, and is configured to control the connection and the disconnection between the first control node and the pull-up node under control of a voltage of the second clock signal terminal; and
   the first control terminal is a fourth voltage terminal; and
   the first control sub-circuit is configured to transmit a voltage of the fourth voltage terminal to the pull-down node under control of the voltage of the fourth voltage terminal, and/or transmit the voltage of the third voltage terminal to the pull-down node under control of the voltage of the pull-up node.

4. The shift register according to claim 3, wherein the switching sub-circuit includes a fourth transistor, and the first control sub-circuit includes a fifth transistor and a sixth transistor;
   a control electrode of the fourth transistor is connected to the second clock signal terminal, a first electrode of the fourth transistor is connected to the first control node, and a second electrode of the fourth transistor is connected to the pull-up node;
   a control electrode and a first electrode of the fifth transistor are both connected to the fourth voltage terminal, and a second electrode of the fifth transistor is connected to the pull-down node; and
   a control electrode of the sixth transistor is connected to the pull-up node, a first electrode of the sixth transistor is connected to the third voltage terminal, and a second electrode of the sixth transistor is connected to the pull-down node.

5. The shift register according to claim 2, further comprising a switch control sub-circuit and a second storage sub-circuit, wherein
   the switch control sub-circuit is connected to a second clock signal terminal, a second control node, and the pull-up node;
   the switch control sub-circuit is configured to transmit a voltage of the second clock signal terminal to the second control node under control of the voltage of the second clock signal terminal or under the control of the voltage of the pull-up node;
   the second storage sub-circuit is connected to the second control node and the third voltage terminal, and is configured to store a voltage of the second control node, and discharge electricity to the second control node; and
   the switching sulk-circuit is further connected to the second control node, and is configured to control the connection and the disconnection between the first control node and the pull-up node under control of the voltage of the second control node.

6. The shift register according to claim 5, wherein in a case where the shift register further comprises the first control sub-circuit,
   the first control terminal is a fourth voltage terminal;
   the first control sub-circuit is further connected to the second control node; and
   the first control sub-circuit is configured to transmit a voltage of the fourth voltage terminal to the pull-down node under control of the voltage of the second control node, and/or transmit a voltage of the third voltage terminal to the pull-down node under control of the voltage of the pull-up node.

7. The shift register according to claim 6, wherein the switching sub-circuit includes a fourth transistor, the switch control sub-circuit includes a ninth transistor and a tenth transistor, the second storage sub-circuit includes a second capacitor, and the first control sub-circuit includes a. fifth transistor and a sixth transistor;
- a control electrode of the fourth transistor is connected to the second control node, a first electrode of the fourth transistor is connected to the first control node, and a second electrode of the fourth transistor is connected to the pull-up node;
- a control electrode of the ninth transistor is connected to the pull-up node, a first electrode of the ninth transistor is connected to the second clock signal terminal, and a second electrode of the ninth transistor is connected to the second control node;
- a control electrode and a first electrode of the tenth transistor are both connected to the second clock signal terminal, and a second electrode of the tenth transistor is connected to the second control node;
- a first terminal of the second capacitor is connected to the second control node, and a second terminal of the second capacitor is connected to the third voltage terminal;
- a control electrode of the fifth transistor is connected to the second control node, a first electrode of the fifth transistor is connected to the fourth voltage terminal, and a second electrode of the fifth transistor is connected to the pull-down node; and
- a control electrode of the sixth transistor is connected to the pull-up node, a first electrode of the sixth transistor is connected to the third voltage terminal, and a second electrode of the sixth transistor is connected to the pull-down node.

8. The shift register according to claim 5, wherein in a case where the shift register further comprises the first control sub-circuit, the first clock signal terminal, and the second clock signal terminal, the first control sub-circuit is configured to transmit a voltage of the first control terminal to a pull-down node under control of a voltage of the first control terminal, and/or transmit a voltage of the third voltage terminal to the pull-down node under control of the voltage of the pull-up node; and
- the first control terminal is a fourth voltage terminal; or
- the first control terminal is the first clock signal terminal or the second clock signal terminal, and the shift register further comprises a third storage sub-circuit; the third storage sub-circuit is connected to the pull-down node and the third voltage terminal, and is configured to store a voltage of the pull-down node and discharge electricity to the pull-down node.

9. The shift register according, to claim 8, wherein the switching sub-circuit includes a fourth transistor, the switch control sub-circuit includes a ninth transistor and a tenth transistor, the second storage sub-circuit includes a second capacitor, and the first control sub-circuit includes a fifth transistor and a sixth transistor;
- a control electrode of the fourth transistor is connected to the second control node, a first electrode of the fourth transistor is connected to the first control node, and a second electrode of the fourth transistor is connected to the pull-up node;
- a control electrode of the ninth transistor is connected to the pull-up node, a first electrode of the ninth transistor is connected to the second clock signal terminal, and a second electrode of the ninth transistor is connected to the second control node;
- a control electrode and a first electrode of the tenth transistor are both connected to the second clock signal terminal, and a second electrode of the tenth transistor is connected to the second control node;
- a first terminal of the second capacitor is connected to the second control node, and a second terminal is connected to the third voltage terminal;
- a control electrode and a first electrode of the fifth transistor are both connected to the first control terminal, and a second electrode of the fifth transistor is connected to the pull-down node;
- a control electrode of the sixth transistor is connected to the pull-up node, a first electrode of the sixth transistor is connected to the third voltage terminal, and a second electrode of the sixth transistor is connected to the pull-down node.

10. The shift register according to claim 2, wherein
the output sub-circuit includes a third transistor; and a control electrode of the third transistor is connected to the pull-up node, a first electrode of the third transistor is connected to the first clock signal terminal, and a. second electrode of the third transistor is connected to the signal output terminal;
the second control sub-circuit includes an eighth transistor; and a control electrode of the eighth transistor is connected to the pull-down node, a first electrode of the eighth transistor is connected to the third voltage terminal, and a second electrode of the eighth transistor is connected to the pull-up node;
the pull-down sub-circuit includes a seventh transistor; and a control electrode of the seventh. transistor is connected. to the pull-down node, a. first electrode of the seventh transistor is connected to the third voltage terminal, and a second electrode of the seventh transistor is connected to the signal output terminal; and
the first storage sub-circuit includes a first capacitor; and a first terminal of the first capacitor is connected to the pull-up node, and a second terminal of the first capacitor is connected to the signal output terminal.

11. A gate driver circuit, comprising N stages of cascaded shift registers, N being greater than or equal to 2, and N being a positive integer, wherein
each of the shift registers includes:
a first transistor, a control electrode of the first transistor being connected to a signal input terminal, a first electrode of the first transistor being connected to a first voltage terminal, and a second electrode of the first transistor being connected to a first control node;
a second transistor, a control electrode of the second transistor being connected to a reset signal terminal, a first electrode of the second transistor being connected to a second voltage terminal, and a second electrode of the second transistor being. connected to the first control node;
a pull-up node; and
a switching. sub-circuit, an end of the switching sub-circuit being connected to the first control node and another end of the switching sub-circuit being connected to the pull-up node, and the switching sub-circuit being configured to control connection and disconnection between the first control node and the pull-up node;
wherein a signal input terminal of a first-stage shift register is connected to a start signal terminal;

a signal input terminal of an M-th-stage shift register is connected to a signal output terminal of a (M−1)-th-stage shift register, and M is greater than 1 and less than or equal to N;

a reset signal terminal of a K-th-stage shift register is connected to a signal output terminal of a (K+1)-th-stage shift register, and K is greater than or equal to 1 and less than N; and a reset signal terminal of an N-th-stage shift register is connected to a reset signal line, or the reset signal terminal of the N-th-stage shift register is connected to the start signal terminal.

12. A display device, comprising the gate driver circuit according to claim 11.

13. A driving method for a shift register, wherein the shift register includes:

a first transistor, a control electrode of the first transistor being connected to a signal input terminal, a first electrode of the first transistor being connected to a first voltage terminal, and a second electrode of the first transistor being connected to a first control node;

a second transistor, a control electrode of the second transistor being connected to a reset signal terminal, a first electrode of the second transistor being connected to a second voltage terminal, and a second electrode of the second transistor being connected to the first control node;

a pull-up node; and a switching sub-circuit, an end of the switching sub-circuit being connected to the first control node and another end of the switching sub-circuit being connected to the pull-up node, and the switching sub-circuit being configured to control connection and disconnection between the first control node and the pull-up node;

wherein the driving method comprises:

in an input period:

transmitting a turn-on signal to the signal input terminal to control the first transistor to be turned on, so that a voltage of the first voltage terminal is transmitted to the first control node; and controlling the switching sub-circuit to be turned on, so that a voltage of the first control node is transmitted to the pull-up node;

in an output period:

controlling the switching sub-circuit to be turned off, so that the first control node is disconnected with the pull-up node; and in a reset period:

transmitting a reset signal to the reset signal terminal, so that the second transistor is turned on to transmit a voltage of the second voltage terminal to the first control node; and controlling the switching sub-circuit to be turned on to transmit the voltage of the first control node to the pull-up node for resetting.

14. The driving method for the shift register according to claim 13, wherein in a case where the shift register further includes a pull-down node, an output sub-circuit, a first control sub-circuit, a second control sub-circuit, a pull-down sub-circuit, and a first storage sub-circuit, the driving method further comprises:

in the input period:

storing a voltage of the pull-up node in the first storage sub-circuit; and under control of the voltage of the pull-up node, the output sub-circuit being turned on to transmit a voltage of a first clock signal terminal to the signal output terminal;

in the output period:

the first storage sub-circuit discharging electricity to the pull-up node; under the control of the voltage of the pull-up node, the output sub-circuit being maintained in a turn-on state to transmit the voltage of the first clock signal terminal to the signal output terminal; and under control of a voltage of the signal output terminal, further raising, by the first storage sub-circuit, a discharge voltage to the pull-up node; and in the reset period:

under control of a voltage of the pull-down node, the pull-down sub-circuit being turned on to transmit a voltage of the third voltage terminal to the signal output terminal for resetting;

under the control of the voltage of the pull-down node, the second control sub-circuit being turned on to transmit the voltage of the third voltage terminal to the pull-up node for resetting; and before a next image frame, the pull-down sub-circuit being maintained in a turn-on state under the control of the voltage of the pull-down node to continuously transmit the voltage of the third voltage terminal to the signal output terminal.

15. The driving method for the shift register according to claim 14, wherein in a case where the shift register further includes a switch control sub-circuit and a second storage sub-circuit, the driving method further comprises:

in the input period:

under control of a voltage of a second clock signal terminal, the switch control sub-circuit being turned on, so that the voltage of the second clock signal terminal is transmitted to the second control node to control the switching sub-circuit to be turned on;

in the output period:

under the control of the voltage of the pull-up node, the switch control sub-circuit being turned on, so that the voltage of the second clock signal terminal is transmitted to the second control node to control the switching sub-circuit to be turned off; and in the reset period:

under the control of the voltage of the second clock signal terminal, the switch control sub-circuit being, turned on, so that the voltage of the second clock signal terminal is transmitted to the second control node to store the voltage of the second clock signal terminal in the second storage stat-circuit; and the switching sub-circuit being turned on under control of a voltage of the second control node.

16. The shift register according to claim 8, wherein in a case where the first control terminal is the first clock signal terminal or the second clock signal terminal, and the shift register comprises the third storage sub-circuit, the third storage sub-circuit includes a third capacitor, a first terminal of the third capacitor is connected to the pull-down node, and a second terminal of the third capacitor is connected to the third voltage terminal.

17. The driving method for the shift register according to claim 15, the driving method further comprises:

in a discharge period after the reset period:

the second storage sub-circuit discharging to the second control node, so that the switching sub-circuit being maintained in a turn-on state under die control of the voltage of die second control node; and before the next image frame, the switching sub-circuit being maintained in the turn-on state under alternate control of the switch control sub-circuit and the second storage sub-circuit.

\* \* \* \* \*